United States Patent
Chi Chan et al.

(10) Patent No.: US 8,174,096 B2
(45) Date of Patent: May 8, 2012

(54) STAMPED LEADFRAME AND METHOD OF MANUFACTURE THEREOF

(75) Inventors: Tat Chi Chan, Hong Kong (CN); Man Shing Cheng, Hong Kong (CN)

(73) Assignee: ASM Assembly Materials Ltd., Hong Kong (CN)

( * ) Notice: Subject to any disclaimer, the term of this patent is extended or adjusted under 35 U.S.C. 154(b) by 393 days.

(21) Appl. No.: 11/509,860

(22) Filed: Aug. 25, 2006

(65) Prior Publication Data

US 2008/0122048 A1 May 29, 2008

(51) Int. Cl.
*H01L 23/495* (2006.01)

(52) U.S. Cl. ........ 257/666; 257/667; 438/111; 438/112; 438/123

(58) Field of Classification Search .......... 438/111, 438/112, 123; 72/343; 257/666, 667
See application file for complete search history.

(56) References Cited

U.S. PATENT DOCUMENTS

| | | | |
|---|---|---|---|
| 5,172,214 A | | 12/1992 | Casto |
| 5,458,158 A | * | 10/1995 | Kawanabe ............. 140/105 |
| 5,637,915 A | * | 6/1997 | Sato et al. ............. 257/666 |
| 6,143,981 A | | 11/2000 | Glenn |
| 6,208,020 B1 | * | 3/2001 | Minamio et al. ............. 257/684 |
| 6,501,156 B1 | * | 12/2002 | Nakanishi et al. ............. 257/666 |
| 6,943,064 B2 | * | 9/2005 | Shimanuki ............. 438/123 |
| 2001/0007780 A1 | * | 7/2001 | Minamio et al. ............. 438/106 |
| 2003/0071333 A1 | | 4/2003 | Matsuzawa |
| 2005/0199987 A1 | * | 9/2005 | Danno et al. ............. 257/672 |
| 2006/0240599 A1 | * | 10/2006 | Amano et al. ............. 438/123 |

FOREIGN PATENT DOCUMENTS

| | | |
|---|---|---|
| JP | 02-308563 | 12/1990 |
| JP | 2000-260921 | 9/2000 |
| JP | 2008-0002499 | 1/2008 |

OTHER PUBLICATIONS

Notice of Preliminary Rejection mailed Feb. 13, 2009 in corresponding Korean Application No. 10-2007-0085565 (English translation).

* cited by examiner

*Primary Examiner* — Steven Loke
*Assistant Examiner* — Kimberly M Thomas
(74) *Attorney, Agent, or Firm* — Ostrolenk Faber LLP

(57) ABSTRACT

A stamped leadframe for a leadless package and a method of manufacturing the same are provided wherein the leadframe has at least a die pad, a frame, tie bars connecting the die pad to the frame and a plurality of leads. Each lead comprises a first portion and a second portion, and the second portion is connected substantially parallel to and displaced relative to the first portion by a distance that is less than the thickness of the first portion. Portions of the tie-bars and/or die pad may be similarly displaced.

9 Claims, 4 Drawing Sheets

STAMPED LEADFRAME AND METHOD OF MANUFACTURE THEREOF

FIELD OF THE INVENTION

The invention relates to leadframes on which semiconductor integrated circuit ("IC") chips are mounted during assembly and packaging, and in particular to leadframes that are formed by stamping.

BACKGROUND AND PRIOR ART

Semiconductor ICs are typically mass-produced in wafer form, wherein each wafer comprises a large number of manufactured ICs. When wafers with confirmed working ICs are received for assembly and packaging, the wafers are first cut (or "diced") into individual dice or chips by a dicing saw or laser. Each die is then picked up and individually attached to a leadframe or other carrier by a die bonding process. The leadframe provides the interface between the electrical circuit on the IC and external systems with which a packaged semiconductor device is to communicate.

Leadframes are commonly produced by stamping or etching a pattern through a strip of copper or iron-nickel alloy. The electrical connection of the die to the leadframe is made by wire bonding with metal wires or direct flip-chip connection on conductive pads, through which the device is able to communicate with the leadframe and also an external host system.

Leadframes for chip scale packages (CSP) can be formed in several configurations, including quad flat pack no-lead (QFN) packages that are currently a popular form of leadframe-based semiconductor package. These are leadless packages with small form factors that are not much larger than the size of the die, wherein molding with encapsulant material is conducted only on one side of the leadframe. The other unmolded surface is used for locating exposed conductive fingers to communicate with external systems. For example, such QFN packages are disclosed in U.S. Pat. No. 6,143,981 entitled "Plastic Integrated Circuit Package and Method and Leadframe for Making the Package".

Since the leadframe is only molded on one side, there is a greater risk of dislodgement of the encapsulant material since more of the lead is exposed on the surface of the package than in conventional semiconductor packages. This would lead to failure of the package. Accordingly, there is a need to form an interlocking mechanism in the leadframe to enhance the connection between the encapsulant material on the one hand, and the leadframe material on the other hand, as described in the above patent for QFN packages. In order to create a mechanical interlock, reentrant portions and/or asperities are formed in the die pad for attaching the die, and on the inner leads. Such mechanical interlocks also act as moisture barriers to impede moisture from entering the package to come into contact with the internal components of the package which may cause package failure.

Primarily, the aforesaid patent teaches a wet chemical etching approach to form the reentrant portions and asperities. Chemical etching involves using photolithography and chemicals to mill patterns onto leadframes. Portions of the leadframe are etched away to reveal the desired etching pattern. Leadframes are produced by the said etching process for high precision and fast turnaround purposes, and to achieve a shorter time to market. Other advantages of using chemical etching are that there is good lead contour control and the method is applicable to both matrix-type and array-type leadframe layouts. The disadvantage of etching is that it is an expensive process that means higher leadframe costs are incurred.

For certain applications that are less demanding, it is not desirable to employ etching as it is more costly. Thus, an alternative is to employ stamping using punching dies to form the interlocking mechanism. Stamped leadframes are typically used for very high volume production on mature designs to form high density matrix stamped frames.

Although the aforesaid patent also suggests mechanical stamping using progressive dies, the method suggested uses sets of progressive dies to mechanically remove a distinct small area of metal from the strip as the strip moves through the stations to remove metal from the leadframe strip. Such a process is time consuming since it involves punching out material from the leadframe multiple times to cumulatively remove small areas of metal.

A more conventional method for creating stamped frames with the interlocking feature is disclosed in U.S. Pat. No. 5,172,214 entitled "Leadless Semiconductor Device and Method for Making the Same". The leads of the leadframe are stamped and mechanically deformed into a trapezoidal shape to secure or lock the leads into place in a package body. As a result, each lead has a raised first portion, a second portion that is exposed on the bottom surface of the package body and an intermediate portion between the first and second portions. The exposed surfaces of the second portions of the leads allow the packages to be leadless. These packages with stamped leadframes can be made at lower cost.

However, there are also many disadvantages with this approach, such as the difficulty to maintain co-planarity of the raised leads, and to prevent lead tilt and lead twist. Also, the intermediate portion which bends the lead upwards is not usable for making wire connections between the lead and the die, so that the effective usable lead length is further reduced. Since the transitions between the first, intermediate and second portions of the leads are relatively gradual, roll-over of the leads further reduces the flat tip area of the lead that is available for wire bonding, and affects the sharpness of the exposed lead edge.

SUMMARY OF THE INVENTION

It is thus an object of the invention to seek to provide a stamped leadframe that contains an interlocking feature that is cheaper to produce than conventional leadframes that are chemically etched, while avoiding some of the aforesaid drawbacks of conventional stamped leadframes.

According to a first aspect of the invention, there is provided a method of producing a stamped leadframe for a leadless package having at least a die pad, a frame, tie bars connecting the die pad to the frame and a plurality of leads, the method comprising the steps of clamping first and second portions of the leads and shearing the second portion relative to the first portion by a distance that is less than the thickness of the first portion such that the second portion is connected substantially parallel to and displaced relative to the first portion.

According to a second aspect of the invention, there is provided a leadframe comprising: a die pad, a frame and tie bars connecting the die pad to the frame; and a plurality of leads each of which comprises a first portion and a second portion, the second portion of the leads being connected substantially parallel to and displaced with respect to the first portion by a distance that is less than the thickness of the first portion.

According to a third aspect of the invention, there is provided a package for an integrated circuit die comprising: an integrated circuit die; a package body formed of an encapsulant material, the encapsulant material covering said die; a plurality of leads, wherein each lead has a first portion and a second portion, the second portion being connected substantially parallel to and displaced with respect to the first portion by a distance that is less than a thickness of the first portion; and electrical conductors connected between the die and the second portion of the leads; wherein a surface of the die pad and surfaces of the first portion of the leads are exposed in a common plane.

According to a fourth aspect of the invention, there is provided a leadframe structure for making a plurality of encapsulated integrated circuit die packages comprising: a plurality of interconnected metal frames arranged in a matrix; a die pad within and connected to an inside edge of each of the frames by tie bars; and a plurality of leads connected to an inside edge of each frame, wherein the leads include a first portion and a second portion, the second portion being connected substantially parallel to and displaced with respect to the first portion by a distance that is less than a thickness of the first portion.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a stamped leadframe and method of manufacturing the same in accordance with the invention will now be described with reference to the accompanying drawings, in which.

DETAILED DESCRIPTION OF THE PREFERRED EMBODIMENT OF THE INVENTION

Figure 1:
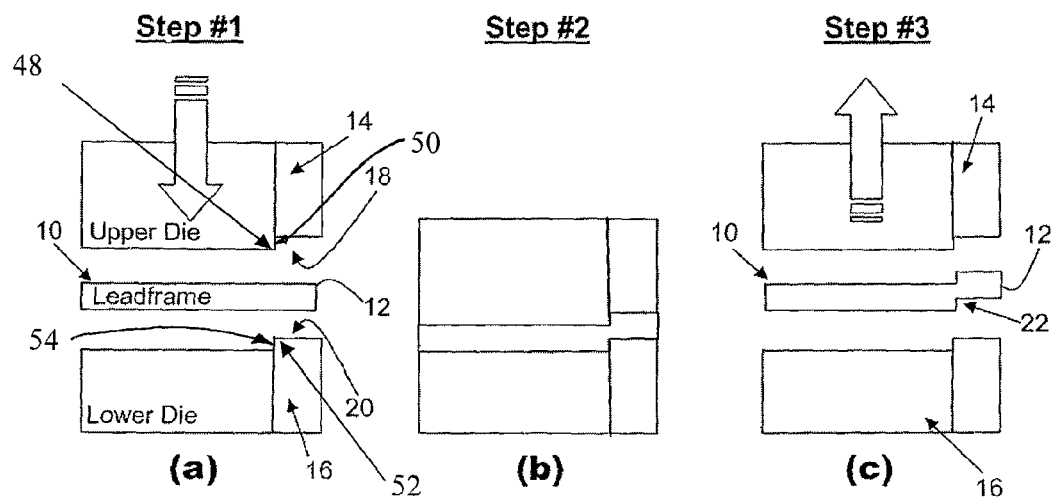
FIG. 1 is a schematic overview of a process according to the preferred embodiment of the invention for stamping a leadframe.

FIG. 1 is a schematic overview of a process for producing a stamped leadframe for a leadless package according to the preferred embodiment of the invention for stamping a leadframe 10. FIG. 1(a) shows a leadframe 10 having a lead 12 to be stamped being introduced into a stamping apparatus comprising an upper die 14 and a lower die 16. The upper die 14 has a stepped portion 48 with a recessed part 18 and a vertical raising edge 50. The lower die has a corresponding stepped portion 52 with a protruding part 20 and a vertical raising edge 54. The vertical rasing edge of the stepped portion 52 is preferably aligned with the vertical rasing edge of the stepped portion 48, and the protruding part 20 is preferably sized to be receivable within the recessed part 18. Vertical raising edges 52, 54 are perpendicular to the horizontal clamped surface of the leadframe 10.

In FIG. 1(b), the upper die 14 has moved downwards and the leadframe 10 is clamped between the upper and lower dies 14, 16. A second displaced portion of the lead 12 is clamped by the recessed and protruding parts 18, 20 of the dies 14, 16, while a first portion comprising the rest of the lead 12 is clamped by the remainder of the dies 14, 16. The second portion of the lead 12 corresponding to its tip end is forcibly displaced by the protruding part 20 in the direction of the recessed part 18. It is partially sheared with respect to the first portion, but remains parallel to the first portion of the lead 12. The stamping is incomplete (as the protruding part 20 does not shear through the lead 12 completely) and is controlled such that the lower die 16 shears the second portion by a distance that is less than the thickness of the first portion.

Preferably, the second portion is sheared by a distance of between ¼ to ¾ of the thickness of the first portion, but more preferably about half the thickness of the first portion. Therefore, the second portion of the lead 12 may be dislocated by approximately half the thickness of the lead 12, while remaining firmly connected to the lead 12. Preferably, the stamping is controlled such that the thicknesses of the first and second portions are substantially maintained.

In FIG. 1(c), the upper die 14 is moved upwards to separate the dies 14, 16 and release the leadframe 10. The resulting lead 12 has a reentrant portion 22 corresponding to the extent to which the lower die 16 had punched through the lead 12 and to which the end portion of the lead 12 has been dislocated.

Figure 2:
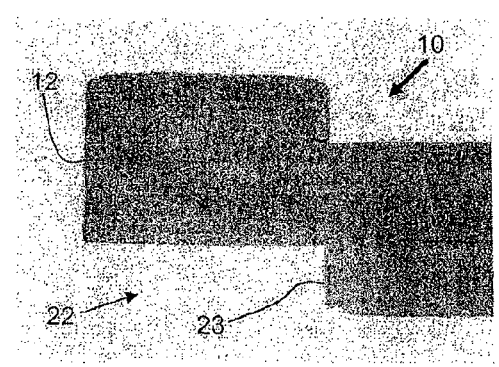
FIG. 2 is a cross-sectional side view of an end portion of a lead comprised in a stamped leadframe according to the invention.

FIG. 2 is a cross-sectional side view of an end portion of a lead 12 comprised in a stamped leadframe according to the invention. It shows the reentrant portion 22 formed in the lead 12 of the leadframe 10. The reentrant portion 22 can act as an interlocking mechanism for encapsulant material when the leadframe 10 is molded. The reentrant portion 22 is adjacent to the first and second portions of the lead 12 and has a sidewall 23 that is substantially perpendicular to the surfaces of the first and second portions.

Figure 3:
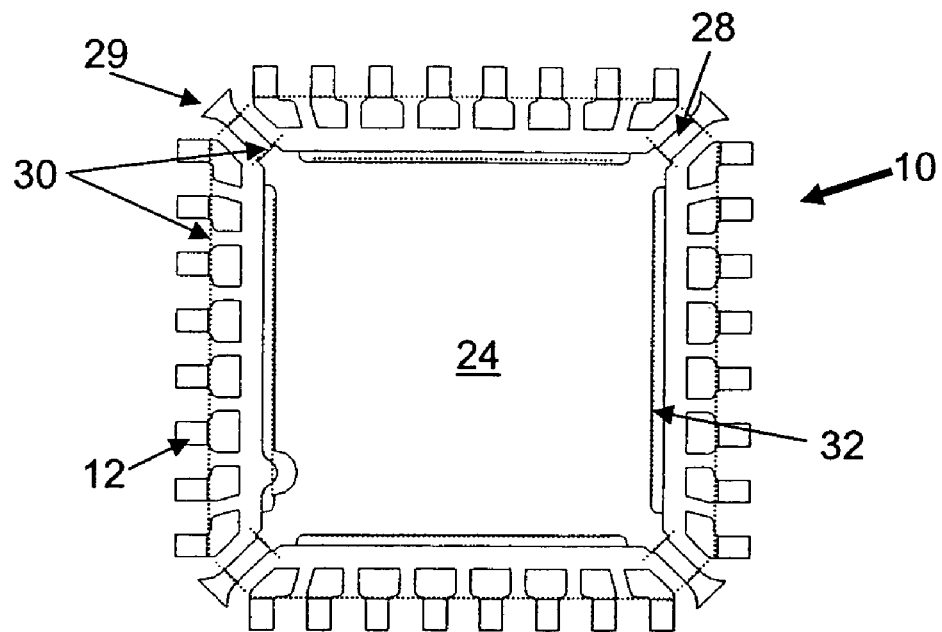
FIG. 3 is a plan view of a bottom surface of the stamped leadframe.

FIG. 3 is a plan view of a bottom surface of the stamped leadframe 10. The leadframe 10 comprises a die pad 24 on which a die (not shown) is to be attached, and a plurality of leads 12 surrounding the die pad 24. The end portions of the leads 12 have already been raised by stamping. The die pad 24 is connected to a frame 29 of the leadframe 10 by tie-bars 28. Typically, there is a tie-bar 28 at each corner of the die pad 24.

FIG. 3 also shows the lines along which the stamping of the leadframe 10 is to be conducted. Stamping lines 30 show the lines along which the leads 12 and tie-bars 28 should be stamped, and stamping lines 32 show the lines along which the die pad 24 should be stamped. Accordingly, the stamping process as explained in FIG. 1 above should preferably be applied to the midsection of the tie-bars 28, in addition to the leads 12. In each case, the first and second portions of the tie-bars are clamped, and the second portion is sheared relative to the first portion by a distance that is less than the thickness of the first portion such that the second portion is connected substantially parallel to and displaced relative to the first portion of the tie-bars.

As for the die pad 24, the edges thereof may be either deep-coined, or displaced just like the leads 12. "Deep-coining" refers to using mechanical depression to squeeze the edges of the die pad 24 to achieve a reduced thickness at the edges. Thus, the edges are not displaced but their thickness is reduced, most preferably by about half. In a first preferred embodiment of the invention, the edges of the die pad 24 are deep-coined.

Figure 4:
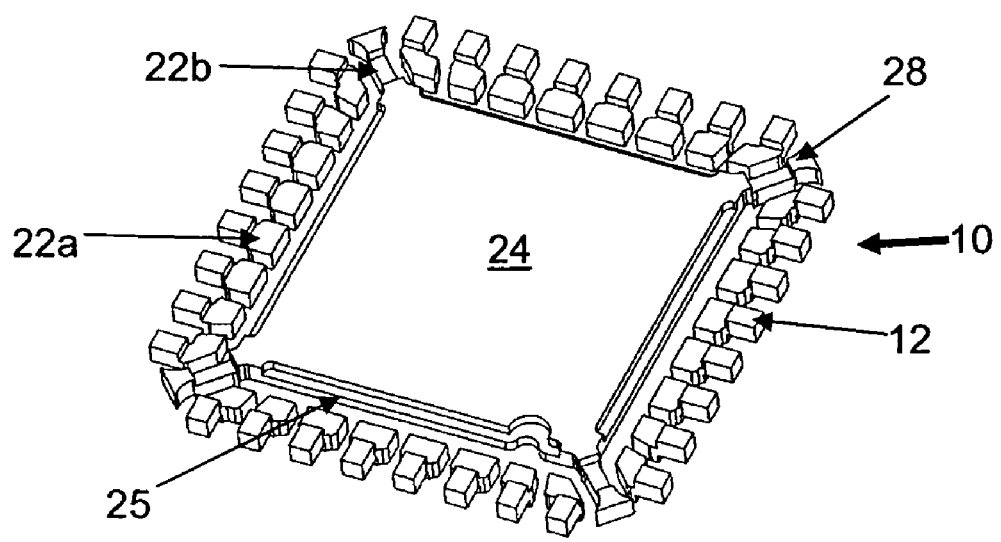
FIG. 4 is an isometric view of the bottom surface of the stamped leadframe.

FIG. 4 is an isometric view of the bottom surface of the stamped leadframe 10. From this view, it can be observed that reentrant portions 22a have been formed in the leads 12 by stamping to raise and dislocate the tips of the leads 12. Reentrant portions 22b have also been formed in the midsections of the tie-bars 28 by raising their midsections. Preferably, the midsections of the tie-bars 28 that are dislocated are located between separate sections of the tie-bars 28 that are not dislocated. These midsections have been dislocated together with the end portions of the leads 12. Furthermore, the edges of the die pad 24 have coined portions 25 that have been formed by deep-coining.

These reentrant portions 22a, 22b and coined portions 25 form interlocking mechanisms to enhance adhesion of encapsulant material and to act as moisture barriers. It should be noted that since the dislocated portions of the leads 12 are used for wire bonding, suitable support such as a top plate should be positioned underneath the leads 12 to support them and to prevent the dislocated portions of the leads from bending during wire bonding when force and power are exerted on them.

Figure 5:
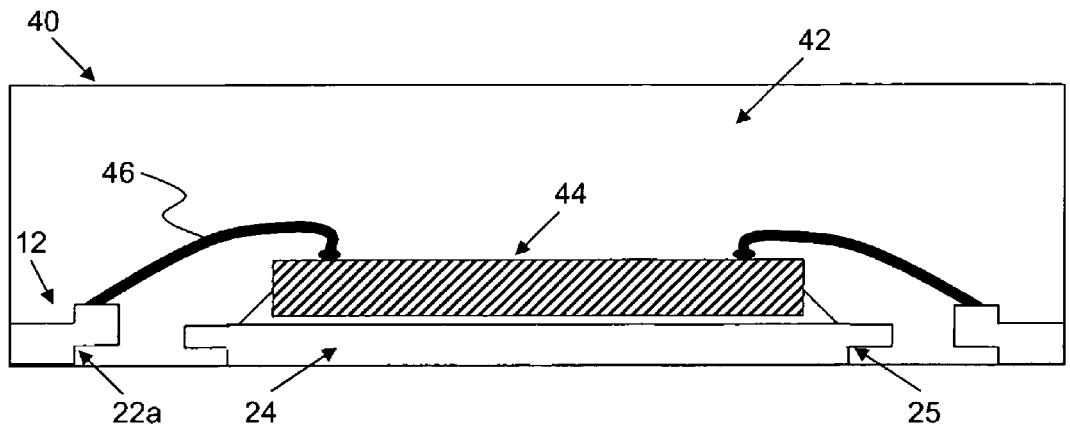
FIG. 5 is a cross-sectional view of a leadless package according to a first preferred embodiment of the invention.

FIG. 5 is a cross-sectional view of a leadless package according to a first preferred embodiment of the invention, wherein the edges of the die pad 24 have been deep-coined. An integrated circuit die 44 is attached onto the die pad 24 using an adhesive. Electrical conductors, such as wires 46, serve to electrically connect the die 44 to the leads 12, via the second portion of the leads 12 that have been dislocated. Encapsulant material 42 covers one side of the leadframe, including the die 44. Reentrant portions 22a are located underneath the second portions of the and leads 12, whereas coined portions 25 are located on the lower surface of the die pad 24 respectively to form interlocks to secure the encapsulant material 42. A typical leadframe comprises a plurality of interconnected metal frames 29 arranged in a matrix. Thus, a molded leadframe would comprise a number of such packages 40 arranged in matrix form on the leadframe.

Figure 6:
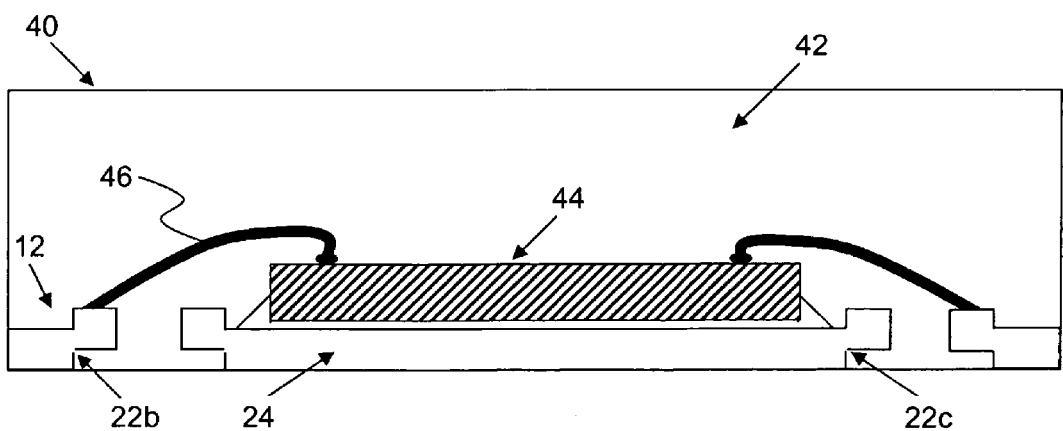
FIG. 6 is a cross-sectional view of a leadless package according to a second preferred embodiment of the invention.

FIG. 6 is a cross-sectional view of a leadless package 40 according to a second preferred embodiment of the invention, wherein the edges of the die pad 24 have been displaced. An integrated circuit die 44 is attached onto the die pad 24 using an adhesive, and wires 46 electrically connect the die 44 to the leads 12, via the second portion of the leads 12 that have been dislocated. Encapsulant material 42 covers one side of the leadframe, including the die 44. Reentrant portions 22a are located underneath the second portions of the leads 12. Furthermore, reentrant portions 22c are also located underneath the second portions of the die pad 24 to form interlocks to secure the encapsulant material 42. In this embodiment, the edges of the die pad 24 have been displaced according to the process explained in relation to FIG. 1, namely that the first and second portions of the edges of the die pad 24 are clamped, and the second portion is sheared relative to the first portion by a distance that is less than the thickness of the first portion such that the second portion is connected substantially parallel to and displaced relative to the first portion of the die pad 24.

Figure 7:
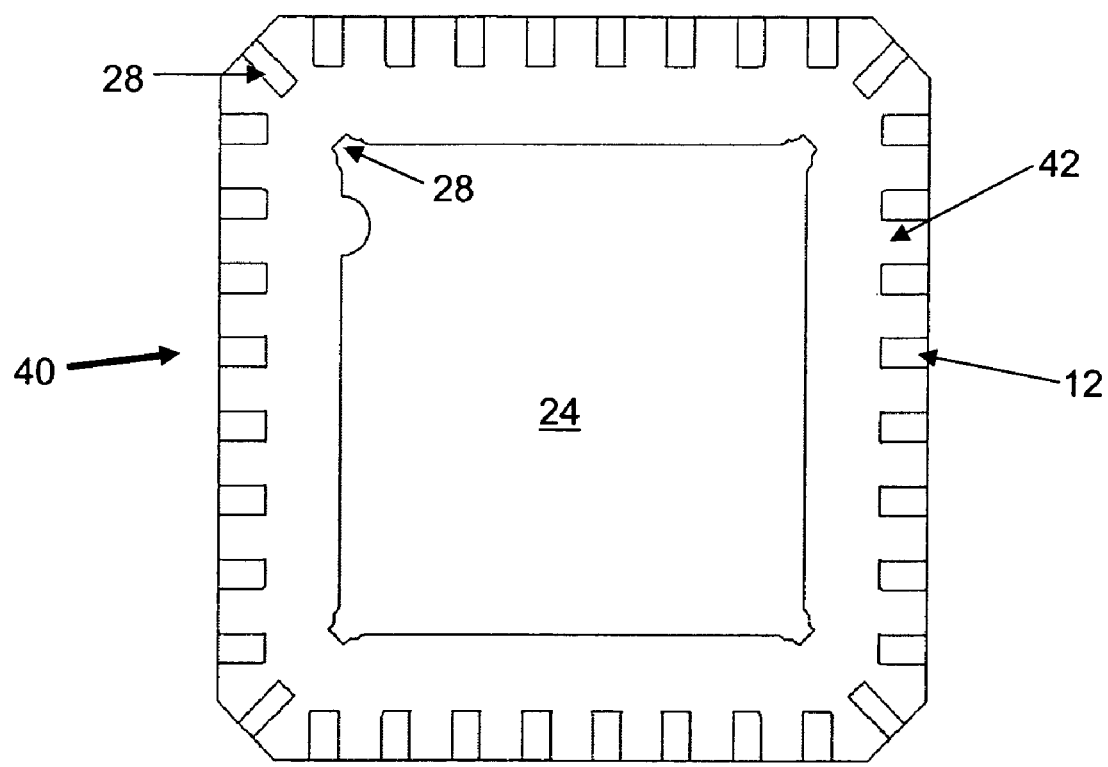
FIG. 7 is a plan view of a bottom surface of a package formed from molding the stamped leadframe according to the preferred embodiments of the invention.

FIG. 7 is a plan view of a bottom surface of a package 40 formed from molding the stamped leadframe 10 according to the preferred embodiments of the invention. Encapsulant material 42 has covered most of the package 40 and one side of the leadframe 10 is left exposed. The exposed portions of the leadframe 10 comprise primarily of surfaces of the first portion of the leads 12, surfaces of the first portion of the tie-bars 28 and the surface of the first portion of the die pad 24. The leads 12 act as electrically conductive fingers to allow the encapsulated die to communicate with external devices. As previously discussed, the second portion of the leads 12, tie-bars 28 and die pad 24 have been raised during stamping, and they are hidden within the encapsulant material 42 after molding to form the interlock.

It would be appreciated that this new manufacturing process is useful to form interlocking mechanisms for leadframes for leadless packages, while avoiding the higher cost of wet chemical etching processes. Moreover, as compared to other stamping processes, the contour of the raised leads can be better controlled because the end portions of the leads are not squeezed to result in thinning of the lead, but are only partially dislocated. The extent of dislocation is minimized and metal-to-metal space control as well as height control can be enhanced. Hence, the leadframe according to the preferred embodiment of the invention is easier to manufacture. Further, by avoiding an unusable intermediate portion behind a wire bonding portion of the lead, wasted space on the lead is also minimized.

The invention described herein is susceptible to variations, modifications and/or additions other than those specifically described and it is to be understood that the invention includes all such variations, modifications and/or additions which fall within the spirit and scope of the above description.

The invention claimed is:

1. A method of producing a stamped leadframe for a leadless package having at least a die pad, a frame, tie bars connecting the die pad to the frame and a plurality of leads, the method comprising the steps of:

clamping a first portion and a second portion of at least one lead between an upper die and a lower die, each die having a stepped portion and a raising edge of the stepped portion, the raising edge of the stepped portion of each die being perpendicular to a clamped surface of the lead, and a raising edge of the stepped portion of the upper die being aligned with and lying on a same vertical plane with a raising edge of the stepped portion of the lower die during the clamping step; and dislocating the second portion relative to the first portion by shearing the second portion relative to the first portion with the stepped portions of the upper and lower dies by a distance that is less than a thickness of the first portion, the dislocating being carried out such that the second portion is connected to, substantially parallel to and displaced relative to the first portion.

2. The method as claimed in claim 1, including the step of controlling a displacement of the second portion of the at least one lead such that the thickness of the first portion and a thickness of the second portion are substantially unchanged.

3. The method as claimed in claim 1, wherein the second portion of the at least one lead is sheared by a distance of between ¼ and ¾ of the thickness of the first portion.

4. The method as claimed in claim 1, wherein the shearing of the second portion of the at least one lead creates a reentrant portion adjacent to the first and second portions, the reentrant portion having a sidewall which is substantially perpendicular to surfaces of the first and second portions.

5. The method as claimed in claim 1, further comprising the step of clamping a first portion and a second portion of at least one tie bar and shearing the second portion of the at least one tie bar relative to the first portion of the at least one tie bar by a distance that is less than a thickness of the first portion of the at least one tie bar, the shearing being carried out such that the second portion of the at least one tie bar is connected to, substantially parallel to and displaced relative to the first portion of the at least one tie bar.

6. The method as claimed in claim 5, wherein the first portion of the at least one tie bar comprises separate sections and the second portion of the at least one tie bar is located at a midsection between the separate sections, the midsection being sheared in the shearing step.

7. The method as claimed in claim 5, further comprising the step of molding the leadframe so that surfaces of the first portion of the at least one tie bar are exposed after molding.

8. The method as claimed in claim 1, further comprising the step of clamping a first portion and a second portion of the die pad and shearing the second portion of the die pad relative to the first portion of the die pad by a distance that is less than a thickness of the first portion of the die pad, the shearing being carried out such that the second portion of the die pad is connected to, substantially parallel to and displaced relative to the first portion of the die pad.

9. The method as claimed in claim 1, further comprising the step of molding the leadframe so that a surface of the die pad and surfaces of the first portion of the at least one lead are exposed after the molding.

\* \* \* \* \*